United States Patent
Juang et al.

(10) Patent No.: US 10,580,957 B2
(45) Date of Patent: Mar. 3, 2020

(54) THERMOELECTRIC MATERIAL STRUCTURE

(71) Applicant: SULFURSCIENCE TECHNOLOGY CO., LTD, Taipei (TW)

(72) Inventors: Zhen-Yu Juang, Taipei (TW); Ho-Wei Wang, Taipei (TW); Sung-Yen Wei, Zhubei (TW)

(73) Assignee: SULFURSCIENCE TECHNOLOGY CO., LTD., Taipei (TW)

( * ) Notice: Subject to any disclaimer, the term of this patent is extended or adjusted under 35 U.S.C. 154(b) by 191 days.

(21) Appl. No.: 15/700,591

(22) Filed: Sep. 11, 2017

(65) Prior Publication Data

US 2018/0138388 A1    May 17, 2018

(30) Foreign Application Priority Data

Nov. 11, 2016    (CN) .......................... 2016 1 0995094

(51) Int. Cl.
*B32B 9/04*        (2006.01)
*H01L 37/02*       (2006.01)
*B32B 5/16*        (2006.01)

(52) U.S. Cl.
CPC .............. *H01L 37/025* (2013.01); *B32B 5/16* (2013.01); *B32B 9/04* (2013.01); *B32B 9/048* (2013.01); *B32B 2264/102* (2013.01); *B32B 2264/108* (2013.01); *B32B 2307/202* (2013.01)

(58) Field of Classification Search
None
See application file for complete search history.

(56) References Cited

U.S. PATENT DOCUMENTS

2014/0373891 A1    12/2014    Lee et al.

*Primary Examiner* — Sheeba Ahmed
(74) *Attorney, Agent, or Firm* — Muncy, Geissler, Olds & Lowe, P.C.

(57) ABSTRACT

A thermoelectric material structure includes a substrate, at least one spacing layer, and at least one two-dimensional (2D) material layer. The substrate has a surface. The 2D material layer and the spacing layer are overlapped and disposed on the surface of the substrate. The thermal conductivity of the 2D material layer along the direction perpendicular to the surface of the substrate is less than 10 W/mK.

18 Claims, 4 Drawing Sheets

THERMOELECTRIC MATERIAL STRUCTURE

CROSS REFERENCE TO RELATED APPLICATIONS

This Non-provisional application claims priority under 35 U.S.C. § 119(a) on Patent Application No(s). 201610995094.X filed in People's Republic of China on Nov. 11, 2016, the entire contents of which are hereby incorporated by reference.

BACKGROUND OF THE INVENTION

Field of Invention

The present disclosure relates to a material structure and, in particular to a thermoelectric material structure.

Related Art

In the recent years, the issues of environmental warming and environmental awareness have been paid attentions, and the research topics about how to save energy and improve energy efficiency are accordingly very popular. "Thermoelectric material" is a functional material capable of converting thermal energy into electrical energy without the assistance of other specific external forces or mechanical parts. In the current industries, thermoelectric materials can be used in the applications such as thermoelectric coolers, semiconductor chip cooling, thermoelectric generators, space applications, or other thermoelectric energy conversion.

The energy conversion efficiency of thermoelectric materials generally depends on the thermoelectric figure of merit (ZT), which is shown as the follow equation:

$$ZT = \frac{\alpha^2 \sigma}{k} T$$

Wherein, α is the Seebeck coefficient, σ is the electrical conductivity, k is the thermal conductivity, which is the sum of the electron thermal conductivity ke and the phonon thermal conductivity kL, and T is the operating temperature (absolute temperature). When the ZT is higher, the better the performance of the thermoelectric material and the higher the thermoelectric conversion efficiency.

According to the above equation, the ZT value can be increased by increasing the Seebeck coefficient α and/or the electrical conductivity σ, or by reducing the thermal conductivity k. In the conventional art, the ZT value is usually increased by increasing the Seebeck coefficient α or the electrical conductivity σ. In practice, when increasing the Seebeck coefficient α, the ZT value can be obviously increased.

SUMMARY OF THE INVENTION

An objective of the disclosure is to provide a thermoelectric material structure that can increase its ZT value by a manner other than the general approach of increasing the Seebeck coefficient α the electrical conductivity. In addition, the thermoelectric material structure of the disclosure has lower manufacturing cost and can be manufactured with different characteristics according to various applications, thereby obtaining a higher thermoelectric conversion efficiency.

To achieve the above objective, the present disclosure provides a thermoelectric material structure, which includes a substrate, at least a spacing layer and at least a two-dimensional (2D) material layer. The substrate has a surface. The 2D material layer and the spacing layer are overlapped and disposed on the surface of the substrate. A thermal conductivity of the 2D material layer along the direction perpendicular to the surface of the substrate is less than 10 W/mK.

In one embodiment, the spacing layer or the 2D material layer comprises an electric conductive material.

In one embodiment, the spacing layer is a layer made of a 2D material, or a layer made of nanoparticles or nanostructures.

In one embodiment, the spacing layer is made of graphene, reduced graphene oxide, carbon-based and boron-based materials, chalcogenides, phosphorene, silicene, 2D materials, thermoelectric materials, $C_{60}$ cluster nanoparticles, conductive nanoparticles, conductive nanocomposite particles, or combinations thereof.

In one embodiment, the conductive nanoparticles include metal nanoparticles, alloy nanoparticles, metal oxide nanoparticles, core-shell nanoparticles, or semiconductor conductive nanoparticles.

In one embodiment, the spacing layer is disposed between the 2D material layer and the substrate.

In one embodiment, the 2D material layer is disposed between the spacing layer and the substrate.

In one embodiment, the spacing layer is disposed between two of the 2D material layers.

In one embodiment, a plurality of the 2D material layers are stacked, and the stacked 2D material layers are overlapped with the spacing layer.

In one embodiment, the spacing layers and the 2D material layers are interposed with each other.

In one embodiment, an amount of the spacing layers is the same as that of the 2D material layers.

In one embodiment, an amount of the spacing layers is different from that of the 2D material layers.

In one embodiment, the thermoelectric material structure is a flexible board or a transparent board.

As mentioned above, the thermoelectric material structure of the disclosure includes at least one spacing layer and at least one 2D material layer. The 2D material layer and the spacing layer are overlapped and disposed on the surface of the substrate, and a thermal conductivity of the 2D material layer along the direction perpendicular to the surface of the substrate is less than 10 W/mK. Accordingly, the thermoelectric material structure of the disclosure with the above-mentioned structure design can increase the ZT value thereof by a manner other than the general approach of increasing the Seebeck coefficient α the electrical conductivity. In addition, the thermoelectric material structure of the disclosure has lower manufacturing cost and can be manufactured with different characteristics according to various applications, thereby obtaining a higher thermoelectric conversion efficiency.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

In the conventional art, the ZT value of the thermoelectric conversion material is usually improved by increasing the Seebeck coefficient α or the electrical conductivity σ, thereby obtaining a better thermoelectric conversion efficiency. Different from the conventional art, the thermoelectric material structure of the disclosure can improve the ZT value thereof by reducing the thermal conductivity k, so that the thermoelectric material structure can have higher energy conversion efficiency.

Namely, a "2D material" generally has a height (thickness) within a nanometer scale. Accordingly, the 2D material generally has a planar shape (its height is in the nanometer scale, for example but not limited to 1 to 100 nanometers).

Figure 1:
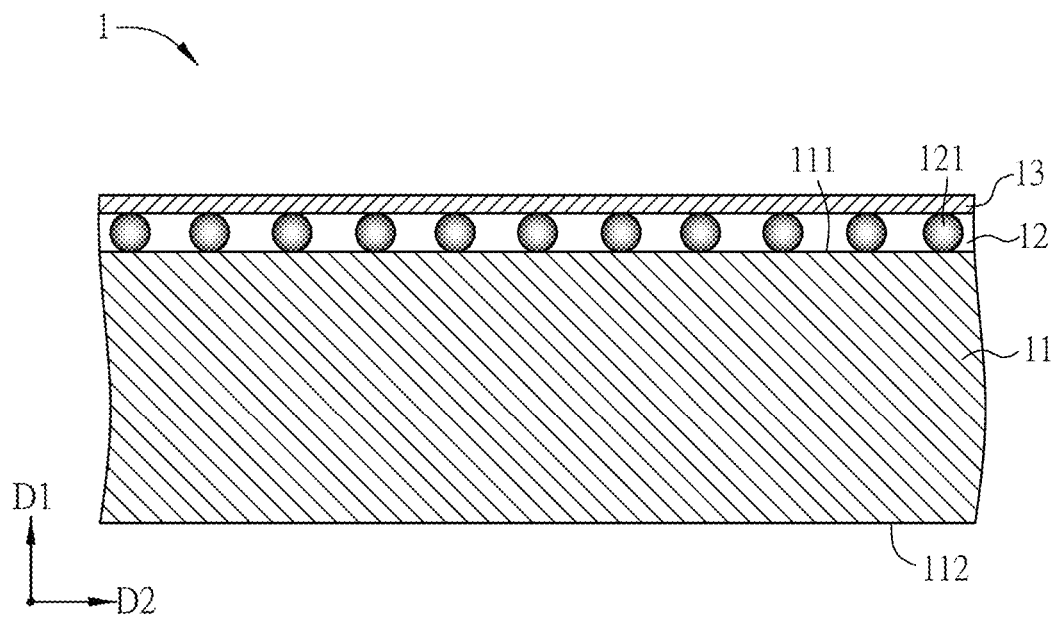
FIG. 1 is a schematic diagram showing a thermoelectric material structure according to an embodiment of the disclosure.

FIG. 1 is a schematic diagram showing a thermoelectric material structure 1 according to an embodiment of the disclosure.

As shown in FIG. 1, the thermoelectric material structure 1 includes a substrate 11, at least one spacing layer 12 and at least one 2D material layer 13.

The substrate 11 has a surface 111. In this embodiment, the surface 111 is the top surface of the substrate 11. The material of the substrate 11 can include, for example but not limited to, glass, quartz, metal, non-metal, or other materials. Besides, the substrate 11 can be a rigid substrate (e.g. a printed circuit board), a flexible substrate, a transparent substrate, or any substrate that can be configured with the spacing layer 12 and the 2D material layer 13. In this embodiment, the material of the substrate 11 is not limited. In this embodiment, a spacing layer 12 and a 2D material layer 13 are stacked and then disposed on the surface 111 of the substrate 11. The spacing layer 12 is disposed between the 2D material layer 13 and the substrate 11. This configuration is for an illustration and is not to limit the invention. In another embodiment, the 2D material layer 13 is disposed between the spacing layer 12 and the substrate 11.

Figure 2A:
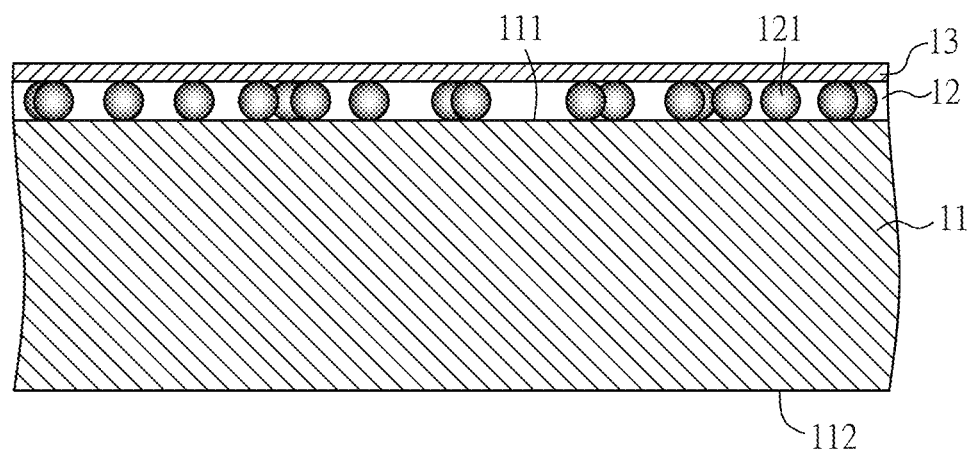
FIGS. 2A to 2B and FIGS. 3A to 3D are schematic diagrams showing different aspects of the thermoelectric material structure of the disclosure.

The spacing layer 12 is a layer made of nanoparticles or nanostructures, contains a plurality of nanoparticles (a nanoparticle layer). As shown in FIG. 1, the material of the spacing layer 12 includes $C_{60}$ cluster nanoparticles, conductive nanoparticles, conductive nanocomposite particles, or combinations thereof. The conductive nanoparticles include metal nanoparticles (e.g. Au), alloy nanoparticles, metal oxide nanoparticles (e.g. CuO or $Cu_2O$), core-shell nanoparticles, or semiconductor conductive nanoparticles. For example, the core-shell nanoparticle has a metal core covered by an oxide compound or a polymer, and this invention is not limited. In this embodiment, the spacing layer 12 is a conductive nanoparticles containing a plurality of conductive nanoparticles. In some embodiments, as shown in FIG. 2A, several nanoparticles 121 of the spacing layer 12 are attached to each other as a group, and this invention is not limited.

Figure 2B:
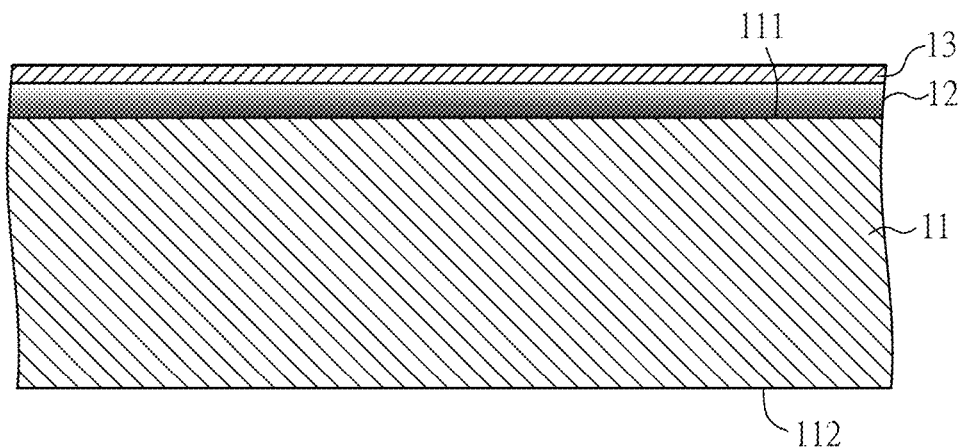

In some embodiments, the spacing layer 12 is also a layer made of a 2D material (2D material layer). As shown in FIG. 2B, the material of the spacing layer 12 includes graphene, reduced graphene oxide (rGO), carbon-based and boron-based (B—C—N) materials, chalcogenides (e.g. $MoS_2$), phosphorene, silicene, thermoelectric materials (e.g. $Bi_2Te_3$, $Sb_2Te_3$, or other thermoelectric materials), or combinations thereof. This invention is not limited.

The spacing layer 12 or the 2D material layer 13 includes electric conductive materials. In this embodiment, both of the spacing layer 12 and the 2D material layer 13 include electric conductive materials. In more detailed, the spacing layer 12 and the 2D material layer 13 both have a good electric conductivity or are semiconductors, so that electrons can be easily transmitted within the spacing layer 12 or the 2D material layer or between the spacing layer 12 or the 2D material layer 13 (cross-plane). The cross-plane direction is the direction D1 perpendicular to the surface 111 of the substrate 11. In this embodiment, since the thickness of the spacing layer 12 is in the nanometer scale (e.g. less than 50 nanometers), the current can flow cross layers (cross-plane). The electron thermal conductivity ke and the phonon thermal conductivity kL along the cross-plane direction (the direction D1) are lower, so that the thermal conductivity k of the thermoelectric material structure 1 is lower. To be noted, the spacing layer 12 allows the transmission of the electrons cross layers (cross-plane), but the transmission of heat cross layers (cross-plane) is difficult. That is, the thermal conductivity of the spacing layer 12 cross layers (cross-plane) is poor, so that it may provide a heat isolation function.

The thermal conductivity of the 2D material layer 13 along the direction D1 perpendicular to the surface 111 of the substrate 11 is less than 10 W/mK. In this embodiment, the thickness of the 2D material layer 13 is in a nanometer scale, and the thermal conductivity of the 2D material layer 13 in the cross-plane direction is less than 10 W/mK. Accordingly, the heat transmitted from the bottom surface (the surface 112) of the substrate to the top surface (the surface 111) of the substrate 11 is difficult to be transmitted to (the top surface of) the 2D material layer 13. Thus, the 2D material layer 13 can have heat isolation function.

The material of the 2D material layer 13 includes graphene, reduced graphene oxide (rGO), carbon-based and boron-based (B—C—N) materials, chalcogenides (e.g. $MoS_2$), phosphorene, silicene, thermoelectric materials (e.g. $Bi_2Te_3$, $Sb_2Te_3$, or other thermoelectric materials), electric conductive materials, or combinations thereof. The electric conductive material is, for example, a metal conductive material, an alloy conductive material, or a semiconductor conductive material, and this invention is not limited. In some embodiments, the material of the 2D material layer 13 includes graphene, which has a thermal conductivity along the cross-plane direction (the direction D1) less than 0.001 W/mK. To be noted, the thermal conductivity of graphene in the direction D2 parallel to the surface 111 of the substrate 11 is very high (e.g. greater than 200 W/mK). In some embodiments, the bottom surface (the surface 112) of the substrate 11 has a higher temperature, so that the heat is usually transmitted from the surface 112 of the substrate 11 to the surface 111 of the substrate 11. However, since the thermal conductivity of the 2D material layer 13 in the direction D1 is very low, it is hard to transmit the heat from the surface 111 of the substrate 11 to (the top surface of) the 2D material layer 13. Accordingly, the thermoelectric material structure 1 can have a very low thermal conductivity k.

In addition, the 2D material layer 13 can be formed with graphene by, for example but not limited to, CVD (Chemical Vapor Deposition) process. Accordingly, the manufacturing cost of the thermoelectric material structure 1 can be further decreased.

FIGS. 3A to 3D are schematic diagrams showing different aspects of the thermoelectric material structures 1a~1d of the disclosure.

Figure 3A:
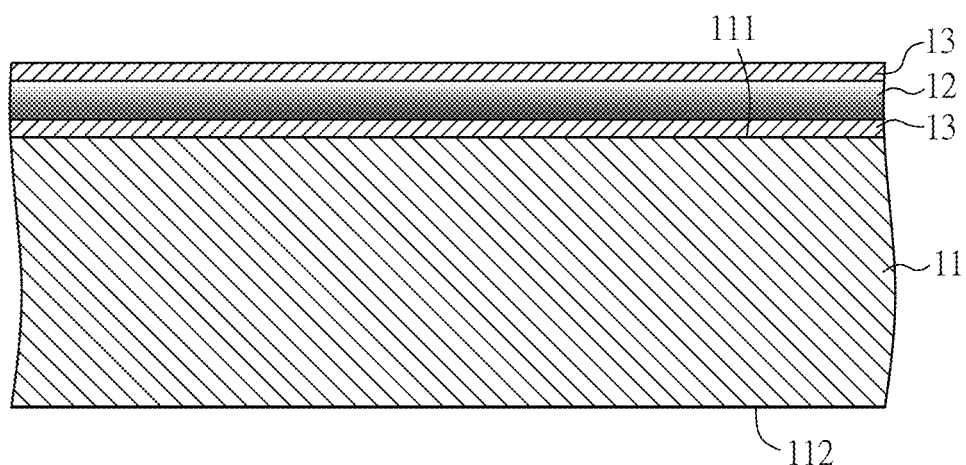

Different from the thermoelectric material structure 1 of FIG. 1, the thermoelectric material structure 1a of FIG. 3A has a 2D material layer 13 disposed between the spacing layer 12 and the substrate 11, and the spacing layer 12 is disposed between two 2D material layers 13. In more detailed, a 2D material layer 13, a spacing layer 12 and another 2D material layer 13 are stacked and then the stacked layers are disposed on the surface 111 of the substrate 11. In this aspect, the amount (1) of the spacing layer 12 is different from the amount (2) of the 2D material layers 13. In addition, the spacing layer 12 is also a layer made of 2D material, so it can be also realized as another 2D material layer. In other embodiments, the spacing layer 12 can be a layer made of nanoparticles or nanostructures, and this invention is not limited.

In one embodiment, the substrate 11 is a quartz substrate, the two 2D material layers 13 are made of graphene, and the spacing layer 12 is a 2D material layer made of $MoS_2$. The measuring result (under room temperature) indicates that the ZT value of the thermoelectric material structure 1a is 1.58.

Figure 3B:
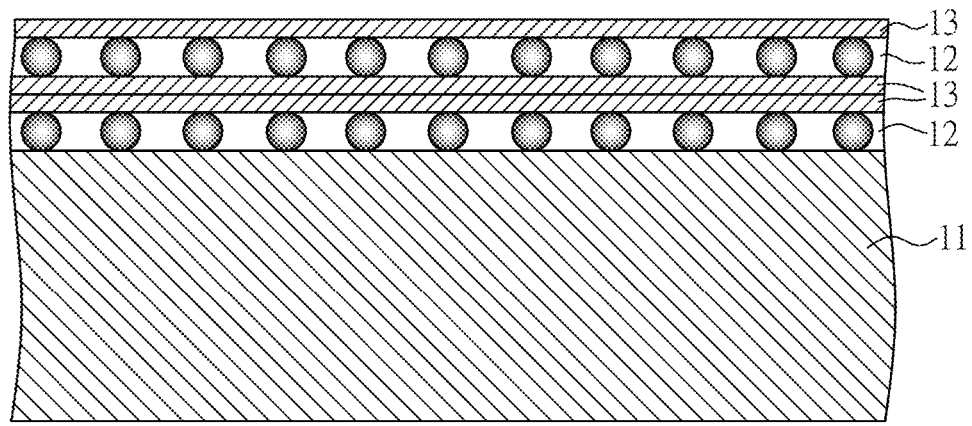

As shown in FIG. 3B, the thermoelectric material structure 1b includes a plurality of spacing layers 12 and a plurality of 2D material layers 13. In more detailed, a stacked structure includes a spacing layer 12, two 2D material layers 13, a spacing layer 12 and a 2D material layer 13 are configured from the button to the top, and then the stacked structure is disposed on the surface of the substrate 11. In this aspect, the amount (2) of the spacing layers 12 is different from the amount (3) of the 2D material layers 13. In addition, the spacing layer 12 is a layer made of nanoparticles. In other embodiments, one or all of the spacing layers 12 can be made of 2D materials. In this embodiment, the two adjacent 2D material layers 13 are stacked in advance and then disposed on the spacing layer 12. Of course, three or more 2D material layers 13 can be stacked and then disposed on the spacing layer 12, and this invention is not limited.

Figure 3C:
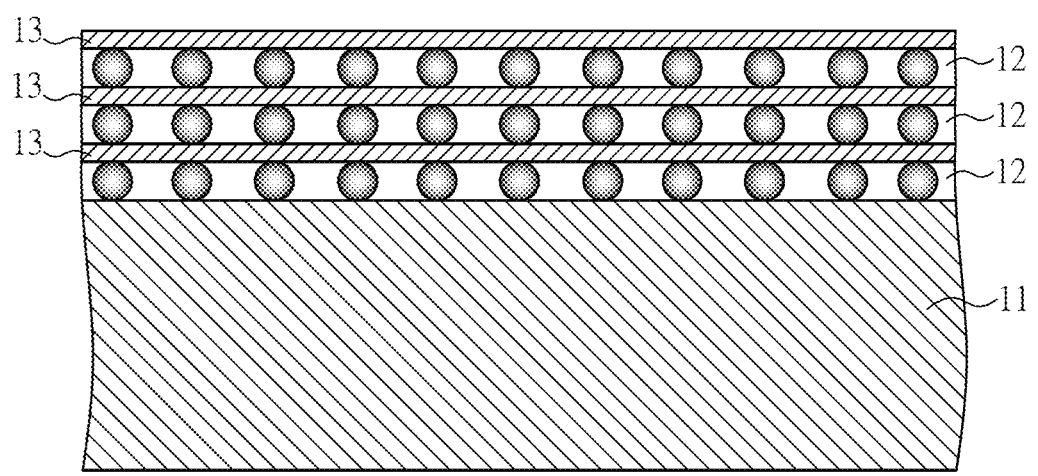

As shown in FIG. 3C, the thermoelectric material structure 1c includes a plurality of spacing layers 12 and a plurality of 2D material layers 13, which are interposed with each other. In more detailed, three spacing layers 12 and three 2D material layers 13 are stacked and interposed with each other, and then the stacked layers are disposed on the surface of the substrate 11. In this aspect, the amount (3) of the spacing layers 12 is the same as the amount (3) of the 2D material layers 13. In other embodiments, the spacing layers 12 can be made of 2D materials, and this invention is not limited.

In one embodiment, the substrate 11 of the thermoelectric material structure 1c is a glass substrate, the 2D material layers 13 are made of graphene, and the spacing layers 12 are made of CuO nanoparticles. The measuring result (under room temperature) indicates that the ZT value of the thermoelectric material structure 1c is between 0.23 and 0.29. To be noted, the measuring temperature is the room temperature instead of the proper operation temperature of the thermoelectric material structure 1c, so the measured ZT value may slightly lower. In another embodiment, the substrate 11 of the thermoelectric material structure 1c is a glass substrate, the 2D material layers 13 are made of graphene, and the spacing layers 12 are made of Au nanoparticles. The measuring result (under room temperature) indicates that the ZT value of the thermoelectric material structure 1c is 1.08.

Figure 3D:
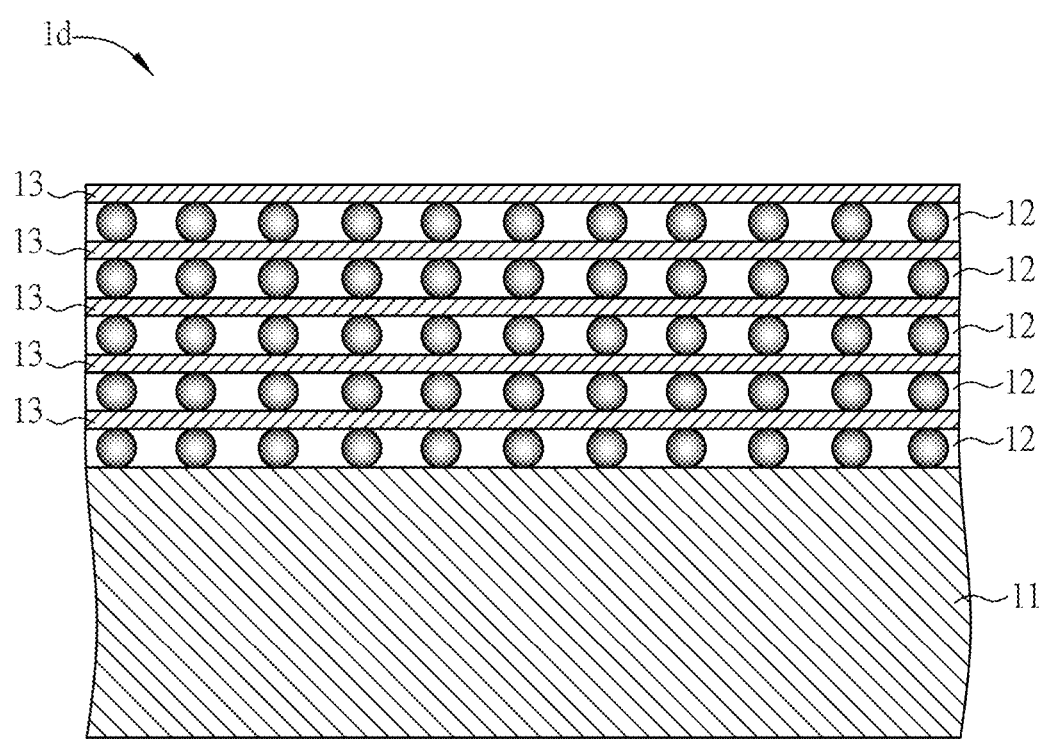

As shown in FIG. 3D, the thermoelectric material structure 1d includes a plurality of spacing layers 12 and a plurality of 2D material layers 13, which are interposed with each other. In more detailed, five spacing layers 12 and five 2D material layers 13 are stacked and interposed with each other, and then the stacked layers are disposed on the surface of the substrate 11. In this aspect, the amount (5) of the spacing layers 12 is the same as the amount (5) of the 2D material layers 13. In other embodiments, the spacing layers 12 can be made of 2D materials, and this invention is not limited. Moreover, it is possible to configure more spacing layers 12 and more 2D material layers 13, which are interposed with each other, on the substrate 11, and this invention is not limited.

In this embodiment, the substrate 11 of the thermoelectric material structure 1d is a glass substrate, the 2D material layers 13 are made of graphene, and the spacing layers 12 are made of $C_{60}$ cluster nanoparticles. The measuring result (under room temperature) indicates that the ZT value of the thermoelectric material structure 1d is between 1.21 and 1.27.

The other technical features of the substrates 11, the spacing layers 12 and 2D material layers 13 of the thermoelectric material structures 1a~1d can be referred to the same components of the thermoelectric material structure 1, so the detailed descriptions thereof will be omitted.

As mentioned above, the thermoelectric material structure of the disclosure includes various possible combinations of layers and materials. Besides, different amounts and different arrangements of the spacing layers and the 2D material layers can be designed based on the requirement of the user for various applications, thereby providing a thermoelectric material structure with lower thermal conductivity and various characteristics (different ZT values). Accordingly, the designer can manufacture the customized thermoelectric material structure with higher ZT value by different stacked layer design according to different operating temperatures and applications, thereby achieving higher thermoelectric conversion efficiency.

In addition, since the spacing layer and the 2D material layer are very thin and are light penetrable, the entire thermoelectric material structure can be a transparent plate if the substrate is transparent (e.g. a glass substrate). In addition, since the spacing layer and the 2D material layer are very thin and flexible, the entire thermoelectric material structure can be a flexible structure if the substrate is flexible. In this case, the thermoelectric material structure can be applied to a nonplanar device.

For example, the spacing layer and the 2D material layer can be overlapped and then attached to the glass (substrate) of a house according to the application requirement (the ZT value for different operation temperatures). In this case, the configured spacing layer and the 2D material layer do not block the light from entering the house, and the thermoelectric material structure has higher ZT value so as to enhance the thermoelectric conversion efficiency thereof. In other applications, when the solar cell receives the solar light, only a very small part of the energy of the solar light can be transformed to generate electric energy and most part of the energy of the solar light are transformed into heat and dissipated. Accordingly, when the thermoelectric material structure with higher ZT value of this disclosure is applied in the solar cell, it is possible to improve the conversion efficiency of the solar cell.

As mentioned above, the thermoelectric material structure of this disclosure has lower cost and can be manufactured with different characteristics depending on various applications. This disclosure can increase the ZT value of the thermoelectric material structure by decreasing the thermal conductivity k, thereby obtaining a higher thermoelectric conversion efficiency. In addition, when the thermoelectric material structure of this disclosure is operated under a proper temperature, the conversion efficiency for converting heat into voltage can be further increased due to the higher ZT value.

In summary, the thermoelectric material structure of the disclosure includes at least one spacing layer and at least one 2D material layer. The 2D material layer and the spacing layer are overlapped and disposed on the surface of the substrate, and a thermal conductivity of the 2D material layer along the direction perpendicular to the surface of the substrate is less than 10 W/mK. Accordingly, the thermoelectric material structure of the disclosure with the above-mentioned structure design can increase the ZT value thereof by a manner other than the general approach of increasing the Seebeck coefficient α the electrical conductivity. In addition, the thermoelectric material structure of the disclosure has lower manufacturing cost and can be manufactured with different characteristics according to various applications, thereby obtaining a higher thermoelectric conversion efficiency.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A thermoelectric material structure, comprising:
a substrate having a surface;
at least a spacing layer, comprising nanoparticles or nanostructures forming gaps in the spacing layer which are not filled with material, and
at least a two-dimensional (2D) material layer, wherein the 2D material layer and the spacing layer are overlapped and disposed on the surface of the substrate, the nanoparticles or nanostructures comprise an electric conductive material, and a thermal conductivity of the 2D material layer along the direction perpendicular to the surface of the substrate is less than 10 W/mK.

2. The thermoelectric material structure of claim 1, wherein the 2D material layer comprises an electric conductive material.

3. The thermoelectric material structure of claim 1, wherein the spacing layer is a layer made of a 2D material, or a layer made of nanoparticles or nanostructures.

4. The thermoelectric material structure of claim 1, wherein the nanoparticles are made of C60 cluster nanoparticles, conductive nanoparticles, conductive nanocomposite particles, or combinations thereof.

5. The thermoelectric material structure of claim 4, wherein the conductive nanoparticles comprise metal nanoparticles, alloy nanoparticles, metal oxide nanoparticles, core-shell nanoparticles, or semiconductor conductive nanoparticles.

6. The thermoelectric material structure of claim 5, wherein the core-shell nanoparticle has a metal core covered by an oxide compound or a polymer.

7. The thermoelectric material structure of claim 1, wherein the 2D material layer comprises graphene, reduced graphene oxide, carbon-based and boron-based materials, chalcogenides, phosphorene, silicene, thermoelectric materials, electric conductive materials, or combinations thereof.

8. The thermoelectric material structure of claim 1, wherein the spacing layer is disposed between the 2D material layer and the substrate.

9. The thermoelectric material structure of claim 1, wherein the 2D material layer is disposed between the spacing layer and the substrate.

10. The thermoelectric material structure of claim 1, wherein the spacing layer is disposed between two of the 2D material layers.

11. The thermoelectric material structure of claim 1, wherein a plurality of the 2D material layers are stacked, and the stacked 2D material layers are overlapped with the spacing layer.

12. The thermoelectric material structure of claim 11, wherein an amount of the spacing layers is the same as that of the 2D material layers.

13. The thermoelectric material structure of claim 11, wherein an amount of the spacing layers is different from that of the 2D material layers.

14. The thermoelectric material structure of claim 1, wherein the thermoelectric material structure comprises a plurality of the spacing layers and a plurality of the 2D material layers, and the spacing layers and the 2D material layers are interposed with each other.

15. The thermoelectric material structure of claim 14, wherein an amount of the spacing layers is the same as that of the 2D material layers.

16. The thermoelectric material structure of claim 14, wherein an amount of the spacing layers is different from that of the 2D material layers.

17. The thermoelectric material structure of claim 1, wherein the thermoelectric material structure is a flexible board or a transparent board.

18. The thermoelectric material structure of claim 1, wherein the substrate is a rigid substrate, a flexible substrate, or a transparent substrate.

* * * * *